United States Patent
Hirata et al.

(10) Patent No.: US 6,191,454 B1
(45) Date of Patent: *Feb. 20, 2001

(54) PROTECTIVE RESISTANCE ELEMENT FOR A SEMICONDUCTOR DEVICE

(75) Inventors: Morihisa Hirata; Kouji Terai, both of Tokyo; Toshiya Hatta, Kanagawa, all of (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/988,474

(22) Filed: Dec. 10, 1997

(30) Foreign Application Priority Data

Dec. 11, 1996 (JP) .................................................. 8-330783

(51) Int. Cl.[7] .................................................... H01L 23/62
(52) U.S. Cl. .......................... 257/360; 257/355; 257/363
(58) Field of Search .................................. 257/355–363, 257/546, 547, 371

(56) References Cited

U.S. PATENT DOCUMENTS

| | | | |
|---|---|---|---|
| 4,757,363 | 7/1988 | Bohm et al. | 357/23 |
| 4,763,184 * | 8/1988 | Krieger et al. | 257/358 |
| 5,270,565 * | 12/1993 | Lee et al. | 257/355 |
| 5,338,964 | 8/1994 | Bernier | 257/476 |
| 5,477,413 * | 12/1995 | Watt | 361/56 |
| 5,576,557 | 11/1996 | Ker et al. | 257/173 |
| 5,623,156 * | 4/1997 | Watt | 257/355 |
| 5,701,024 * | 12/1997 | Watt | 257/360 |
| 5,751,042 * | 5/1998 | Yu | 257/360 |
| 5,811,856 * | 9/1998 | Lee | 257/355 |
| 5,838,033 | 11/1998 | Smooha | 257/213 |

FOREIGN PATENT DOCUMENTS

| | | | |
|---|---|---|---|
| 0 549 320 | 6/1993 | (EP) . | |
| 0 656 659 | 6/1995 | (EP) . | |
| 002598852 * | 11/1987 | (FR) | 257/358 |
| 2 281 813 | 3/1995 | (GB) . | |
| 61-131476 | 6/1986 | (JP) . | |
| 3-184369 | 8/1991 | (JP) . | |
| 404071265 * | 3/1992 | (JP) | 257/358 |
| 7-161990 | 6/1995 | (JP) . | |
| 7-183516 | 7/1995 | (JP) . | |
| 7-202009 | 8/1995 | (JP) . | |

* cited by examiner

*Primary Examiner*—Steven Loke
*Assistant Examiner*—Ori Nadav
(74) *Attorney, Agent, or Firm*—Foley & Lardner

(57) ABSTRACT

A semiconductor device includes a transistor and a protective resistance element. The transistor has first and second impurity regions of a first conductivity type formed on a surface of a substrate and serving as a source and a drain, respectively, and a gate electrode formed on a channel region sandwiched between the first and second impurity regions through a gate insulating film. The protective resistance element has a third impurity region of the first conductivity type formed on the surface of the substrate to be separated from the second impurity region by a predetermined distance, a control electrode formed on the substrate through an insulating film in a surface region sandwiched between the second and third impurity regions, and a well of the first conductivity type formed on the surface of the substrate in the surface region sandwiched between the second and third impurity regions to come into contact with them. The control electrode is connected to the second impurity region, and the well has an impurity concentration lower than those of the second and third impurity regions.

6 Claims, 3 Drawing Sheets

PROTECTIVE RESISTANCE ELEMENT FOR A SEMICONDUCTOR DEVICE

BACKGROUND OF THE INVENTION

The present invention relates to a semiconductor device having a CMOS (Complementary Metal-Oxide Semiconductor) structure and, more particularly, to a semiconductor device having a protective resistance element serving as an input/output protection circuit.

A conventional semiconductor device has a protective resistance element arranged between an input terminal and an internal circuit to protect the internal circuit. FIG. 3 shows such a conventional semiconductor device. Referring to FIG. 3, a p-type well 5 is formed in the surface of a p⁻-type silicon substrate 1 having a flat major surface 3. A transistor 52 having an n-channel MOS structure is formed in the p-type well 5. A first n-type well 4 is formed to be separated from the p-type well 5 by an isolation region, and a transistor 51 having a p-channel MOS structure is formed in the first n-type well 4.

A second n-type well 6 is formed adjacent to the p-type well 5. The second n-type well 6 serves as the diffusion layer of a protective resistance element 53 serving as a protection circuit. The respective regions are partitioned by a silicon oxide film 2 which is selectively formed on the substrate 1 by using selective oxidation, e.g., LOCOS (LOCal Oxidation of Silicon). The silicon oxide film 2 has a depth of, e.g., 400 nm, from the major surface 3 of the substrate 1, and is formed to have a total thickness of 800 nm.

In the transistor 51, a p⁺-type source 12, a p⁺-type drain 13, and an n⁺-type substrate contact region 11 are formed in the major surface 3 of the substrate 1 corresponding to the first n-type well 4. A polysilicon gate electrode 22 is formed in a channel region 31 of the first n-type well 4 through a gate insulating film 21 having a thickness of 30 nm to 50 nm. A side wall 29 is formed to cover the two sides of the gate electrode 22.

In the transistor 52, an n⁺-type source 15, an n⁺-type impurity region 16 as a drain, and a p⁺-type substrate contact region 14 are formed in the major surface 3 of the substrate 1 corresponding to the p-type well 5. A polysilicon gate electrode 24 is formed on a channel region 32 of the p-type well 5 through a gate insulating film 23 having a thickness of 30 nm to 50 nm. Another side wall 29 is formed to cover the two sides of the gate electrode 24.

In the protective resistance element 53, the second n-type well 6 is formed by diffusion simultaneously with the first n-type well 4. The n-type impurity concentration of the second n-type well 6, which determines the resistance of the resistance element, in a surface region 33 is $1 \times 10^{15}$ cm⁻³. An n⁺-type impurity region 17 is formed in the major surface 3 of the,substrate 1 corresponding to the second n-type well 6. The impurity region 16 formed in the p-type well 5 of the transistor 52 extends into the second n-type well 6.

A polysilicon control electrode 26 is formed in the surface region 33 (channel), serving as a resistor against a current in the second n-type well 6, through an insulating film 25 having a thickness of 10 nm to 70 nm. Still another side wall 29 is formed to cover the two sides of the control electrode 26.

The source 12, substrate contact region 11, and gate electrode 22 of the transistor 51, and the control electrode 26 of the protective resistance element 53 are connected to a power line 41, and a positive voltage $V_{DD}$ as a high-potential power supply voltage is applied to them. The source 15, substrate contact region 14, and gate electrode 24 of the transistor 52 are connected to a ground potential $V_{GND}$ as a low-potential power supply voltage through a GND line 44.

The impurity region 17 of the protective resistance element 53 and the drain 13 of the transistor 51 are connected between an input contact 42 and an output contact 43 which is connected to an internal circuit. That is, the protection circuit described above is connected to hang between an external input and the internal circuit.

With the above arrangement, when an abnormal voltage is externally applied, the protection circuit described above is set in a snap-back state to flow the abnormal voltage to the GND line 44. When the snap-back state is effected before the gate insulating film of the transistor constituting the internal circuit causes breakdown, the internal circuit is protected.

The impurity region 16 as the drain and the n⁺-type source 15 of the transistor 52 are respectively connected to an n⁻-type region 16' and an n⁻type region 15' to form an LDD structure. Similarly, in the protective resistance element 53, the impurity region 17 and the impurity region 16 are respectively connected to an n⁻-type region 17' and the n⁻type region 16' through a region under the control electrode 26, thus forming an LDD structure.

These LDD structures smooth the impurity concentration gradient to moderate the electric field applied to them. The n⁺-type region and the n⁺-type source and drain are formed simultaneously, and their n-type surface impurity concentration is $5 \times 10^{20}$ cm⁻³. The surface impurity concentration of the n⁻-type region constituting the LDD is $1 \times 10^{17}$ cm⁻³.

By employing silicide formation, a silicide film 30 is formed by self alignment for achieving a high operation speed on the surface of each of the p⁺- and n⁺-type regions that form a prospective source and drain, by using the silicon oxide film 2 and the corresponding side wall 29 as the mask. Similarly, another silicide film 30 is formed by self alignment on the upper surface of each silicon gate electrode by using the corresponding side wall 29 as the mask.

This silicide formation has become necessary along with the recent increase in operation speed and micropatterning of the CMOS semiconductor device. According to the silicide formation technique, when a refractory metal film is formed on the surface of a silicon substrate including a source, a drain, and the like, and on the surface of a silicon gate electrode, and is annealed for achieving a higher operation speed for a MOS transistor, silicide thin films can be formed on these surfaces by self alignment to decrease their surface resistance.

As described above, since the protective resistance element 53 is formed on the substrate 1, a signal input to the drain 16 of the transistor 52 passes through the protective resistance element 53. As a result, a voltage drop occurs even if the signal input to the drain 16 is an abnormal voltage, so that a high-level abnormal voltage is prevented from being applied to the transistor 52.

Since a gate electrode structure (control electrode 26) is formed on the surface of the diffusion layer of the protective resistance element 53, even if the silicide formation is employed, a silicide film is not formed in this surface region. An undesired decrease in resistance of the surface region can be avoided accordingly, so that a predetermined resistance large enough to decrease the peak value of the surge voltage can be obtained with a diffusion layer (second n-type well 6) having a small area.

To avoid formation of a silicide film, an oxide film, which is thick like the element isolation region, may be formed. In this case, an extra area is needed because of a bird's beak formed on the end portion of the thick oxide film. Then, the oxide film extends by 0.5 μm on each side. In fact, however, since merely a thin gate insulating film having a thickness of about 10 nm to 70 nm is formed in the surface region of the diffusion layer of the protective resistance element 53, this extra portion can be eliminated. As a result, a further increase in integration degree is enabled. Also, an inconvenience of carrier trapping caused by the disorder of crystals at the end portion of the thick oxide film does not occur.

When the control or gate electrode 26 of the protective resistance element 53 is maintained at a fixed potential, this protective resistance element 53 forms a protective resistance element having a stable resistance. More specifically, some insulating film, e.g., an insulating interlayer film or passivation film, is formed on the surface of the diffusion layer of a conventional protective resistance element. In this case, electrons as the carriers of the n-type diffusion layer are trapped by the insulating film, e.g., a silicon oxide film. Then, the current flowing through the surface region of the diffusion layer that determines the resistance changes, and the output characteristics fluctuate. In contrast to this, if the control electrode 26 of the protective resistance element 53 is fixed to, e.g., the $V_{DD}$ at a positive potential, such an inconvenience does not occur.

The protective resistance element 53 is formed between the output contact 43 (input contact 42) and the impurity region 16 of the transistor 52 of the transistors 51 and 52 which serves as the prospective source. In contrast to this, the drain 13 of the transistor 51 is directly connected to the input contact 42 not through the protective resistance element 53.

The reason for this is as follows. Since the majority carriers of the n-channel MOS transistor are electrons, its mobility is large and accordingly the MOS transistor can be set in a snap-back state easily. Then, the potential of the p-type well (potential of the substrate) increases and the ESD breakdown voltage tends to decrease. In contrast to this, in the p-channel MOS transistor, since the majority carriers are holes, the MOS transistor is not easily set in a snap-back state, and the ESD breakdown voltage is higher than that of the n-channel MOS transistor. Regarding the p-channel MOS transistor, its reliability is further improved by employing a protective resistance element.

The conventional arrangement described above has inconveniences as follows. In the above arrangement, the control electrode 26 of the protective resistance element 53 is connected to the power line 41 and is fixed at the positive voltage $V_{DD}$, which is the high-potential power supply voltage. Therefore, as the potential of the power line 41 changes from 0 to $V_{DD}$, the potential between the second n-type well 6 and control electrode 26 changes from $V_{DD}$ to 0, and the resistance of the n-type well also changes accordingly. Design is difficult in the conventional arrangement.

Assume that the potential of the power line 41 becomes substantially equal to the ground potential and that a positive surge is applied to the GND line 44. In this state, when the potential of the input contact 42 increases, a stress is applied to the thin insulating film 25 between the second n-type well 6 and the control electrode 26, and carriers are trapped by the insulating film 25. When the carriers are trapped in this manner, the resistance of the second n-type well 6 changes. In the worst case, breakdown of the insulating film 25 between the second n-type well 6 and the control electrode 26 occurs.

In the conventional arrangement, since the protective resistance element 53 is formed on the substrate 1, a higher potential may be input to the internal circuit. Hence, when a surge is applied, a higher voltage is sometimes input to the internal circuit because of the voltage increase caused by the current flowing into the protective resistance element 53. In this case, the internal circuit is not protected, and in the worst case, the gate insulating film of the transistor constituting the internal circuit may cause breakdown.

SUMMARY OF THE INVENTION

It is an object of the present invention to provide a semiconductor device which can be designed easily and is protected from an abnormal voltage in any case.

In order to achieve the above object, according to the present invention, there is provided a semiconductor device comprising a field effect transistor having first and second diffusion layers of a first conductivity type formed on a surface of a semiconductor substrate and serving as a source and a drain, respectively, and a gate electrode formed on a region sandwiched between the first and second diffusion layers through a gate insulating film, and a protective resistance element having a third diffusion layer of the first conductivity type formed on the surface of the semiconductor substrate to be separated from the second diffusion layer by a predetermined distance, a control electrode formed on the semiconductor substrate through an insulating film in a region sandwiched between the second and third diffusion layers, and a well of the first conductivity type formed on the surface of the semiconductor substrate in the region sandwiched between the second and third diffusion layers to come into contact with the second and third diffusion layers, wherein the control electrode is connected to the second diffusion layer and the well has an impurity concentration lower than those of the second and third diffusion layers.

DESCRIPTION OF THE PREFERRED EMBODIMENTS

The present invention will be described in detail with reference to the accompanying drawings.

First Embodiment

Figure 1A:
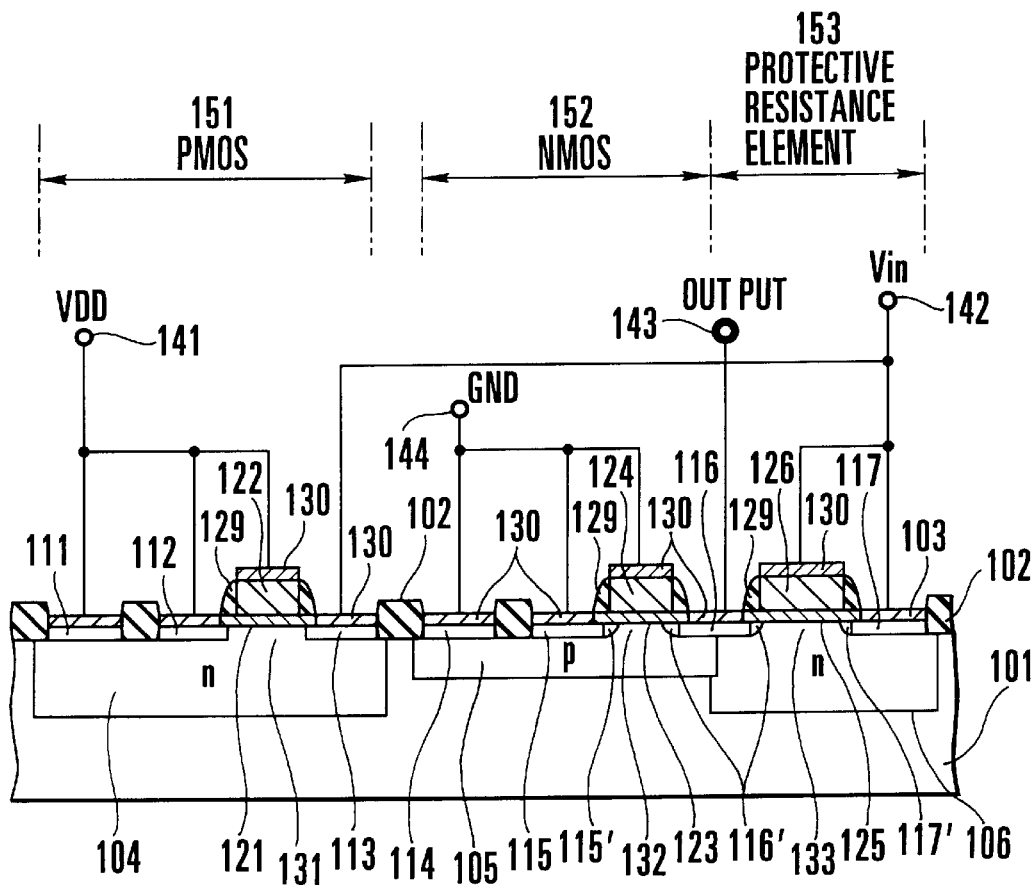
FIG. 1A is a sectional view showing the main part of a semiconductor device according to the first embodiment of the present invention.

FIG. 1A shows the main part of a semiconductor device according to the first embodiment of the present invention. The characteristic feature of the first embodiment resides in that a control electrode 126 is connected to an impurity region 117. Except for this, the arrangement of the first embodiment is the same as the conventional arrangement described above.

Referring to FIG. 1A, a p-type well 105 is formed in the surface of a p⁻-type silicon substrate 101 having a flat major surface 103. A transistor 152 having an n-channel MOS structure is formed in the p-type well 105. A first n-type well 104 is formed to be separated from the p-type well 105 by an isolation region, and a transistor 151 having a p-channel MOS structure is formed in the first n-type well 104.

A second n-type well 106 is formed adjacent to the p-type well 105. The second n-type well 106 serves as the diffusion layer of a protective resistance element 153 serving as a protection circuit. The respective regions are partitioned by a silicon oxide film 102 which is selectively formed on the substrate 101 by using selective oxidation, e.g., LOCOS. The silicon oxide film 102 has a depth of, e.g., 400 nm, from the major surface 103 of the substrate 101, and is formed to have a total thickness of 800 nm. The second n-type well 106 may be formed in a region under a control electrode 126 sandwiched between an impurity region 116 (to be described later) and the impurity region 117 to be adjacent to them.

In the transistor 151, a p$^+$-type source 112, a p$^+$-type drain 113, and an n$^+$-type substrate contact region 111 are formed in the major surface 103 of the substrate 101 corresponding to the first n-type well 104. A polysilicon gate electrode 122 is formed on a channel region 131 of the first n-type well 104 through a gate insulating film 123 having a thickness of 30 nm to 50 nm. A side wall 129 is formed to cover the two sides of the gate electrode 122.

In the transistor 152, an n$^+$-type source 115, the n$^+$-type impurity region 116 as a drain, and a p$^+$-type substrate contact region 114 are formed in the major surface 103 of the substrate 101 corresponding to the p-type well 105. A polysilicon gate electrode 124 is formed on a channel region 132 of the p-type well 105 through a gate insulating film 123 having a thickness of 30 nm to 50 nm. Another side wall 129 is formed to cover the two sides of the gate electrode 124.

The transistors 151 and 152 are formed on the substrate 101 to sandwich the element isolation region 102, and the protective resistance element 153 is formed continuous to the transistor 152.

In the protective resistance element 153, the second n-type well 106 is formed by diffusion simultaneously with the first n-type well 104. The n-type impurity concentration of the second n-type well 106, which determines the resistance of the resistance element, in a surface region 133 is $1 \times 10^{15}$ cm$^{-3}$. The n$^+$-type impurity region 117 is formed in the major surface 103 of the substrate 101 corresponding to the second n-type well 106. The impurity region 116 formed in the p-type well 105 of the transistor 152 extends into the second n-type well 106.

A polysilicon control electrode 126 is formed in the surface region 133 (channel), sandwiched between the first and second impurity regions 116 and 117 and serving as a resistor against a current, of the second n-type well 106 through an insulating film 125 having a thickness of 10 nm to 70 nm. Still another side wall 129 is formed to cover the two sides of the control electrode 126. In the protective resistance element 153, the control electrode 126, the impurity regions 116 and 117, and the surface region 133 under the insulating film 125 where the control electrode 126 is formed, constitute a MOS transistor.

The source 112, substrate contact region 111, and gate electrode 122 of the transistor 151 are connected to a power line 141, and a positive voltage $V_{DD}$ as a high-potential power supply voltage is supplied to them. The source 115, substrate contact region 114, and gate electrode 124 of the transistor 152 are connected to a ground potential $V_{GND}$ as a low-potential power supply voltage through a GND line 144.

In the first embodiment, an external signal is input to the control electrode 126 and impurity region 117 of the protective resistance element 153 connected to an input contact 142, and to a drain 113 of the transistor 151. The p$^+$-type drain 113 of the transistor 151 is connected to an output terminal 143 connected to the internal circuit.

With the above connection arrangement, when the potential of the power line 141 becomes substantially equal to the ground potential, even if a positive surge is applied to the GND line 144, no stress is applied to the insulating film 125 since the control electrode 126 is set at the same potential as that of the impurity region 117.

The potential difference between the second n-type well 106 and the control electrode 126 is about $\frac{1}{10}$ $V_{DD}$ at maximum. A change in resistance of the second n-type well 106 serving as the resistor of the protective resistance element 153 is small, facilitating design.

A change in resistance of the second n-type well 106 will be described. The electric conductivity of the second n-type well 106 serving as the resistor is determined mainly by the drift current of the electrons (carriers).

A drift current Ie is defined by the following equation (1):

$$Ie = e \cdot n \cdot \mu e \cdot F = e \cdot n \cdot ve \tag{1}$$

where e is the elementary electric charge, n is the electron density, $\mu e$ is the electron mobility, ve is the drift velocity, and F is the electric field. Note that in this case the electric field F is (drain voltage-source voltage)/gate length.

The electron density changes in accordance with the potential difference between the control electrode 126 and second n-type well 106. When the gate voltage is higher than the drain voltage, an electron accumulation layer is formed in a region under the gate electrode, and the electron density increases accordingly. More specifically, when the drain voltage changes with respect to the gate voltage, the electron density under the control electrode 126 changes, and the drift current in the second n-type well 106 changes. As a result, the electric conductivity of the second n-type well 106 changes, and the resistance of the second n-type well 106 changes accordingly.

However, as described above, since the control electrode 126 is connected to the impurity region 117 (drain) to be set at the same potential as that of the impurity region 117, the resistance of the second n-type well 106 does not change.

According to the first embodiment, since the control electrode 126 is connected to the impurity region 117, the resistance of the second n-type well 106 that exhibits the function as the resistor of the protective resistance element 153 does not substantially change. Even if a positive surge is applied to the GND line 144, no stress is applied to the insulating film 125.

In the first embodiment, since an input to the internal circuit is extracted from the impurity region 116, despite the presence of the protective resistance element 153, no unnecessarily high potential will be applied to the internal circuit.

Connection of the control electrode 126 and impurity region 117 is preferably performed in the region of the second n-type well 106. This is due to the following reason. When a positive surge is applied to the GND line 144, if the connecting portion (contact portion) is located on a p-type region other than the second n-type well 106, since this p-type region is fixed at the GND potential, a high electric field is applied to the connecting portion between the control electrode 126 and impurity region 117 to break it.

In contrast to this, if connection of the control electrode 126 and impurity region 117 is performed in the region on the second n-type well 106, since the second n-type well 106 and the connecting portion are at the same potential, the connecting portion does not cause breakdown.

Figure 1B:
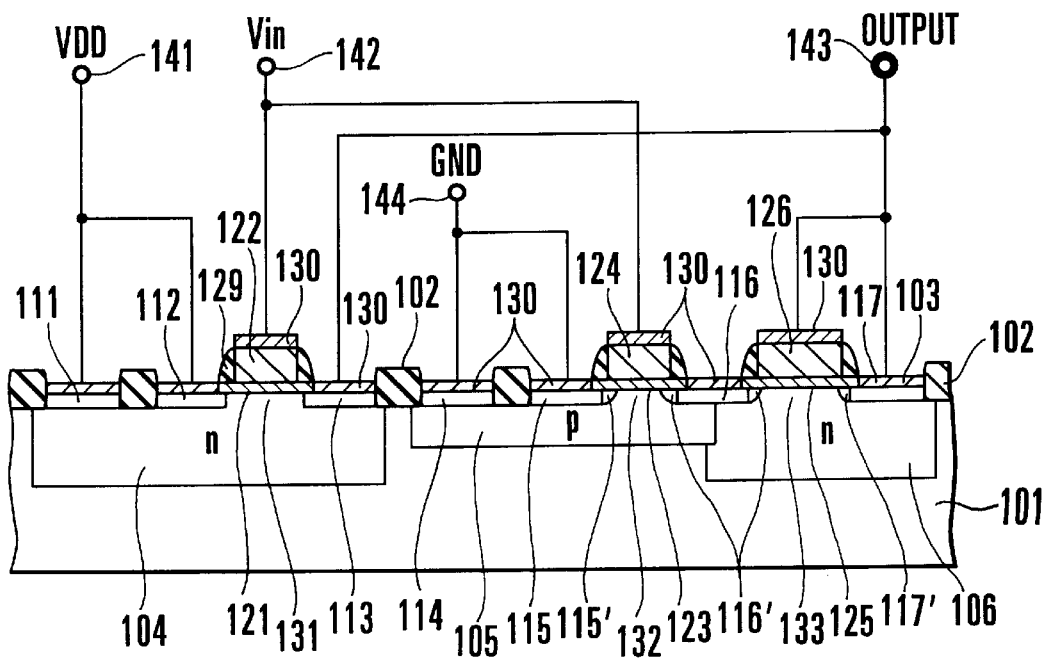
FIG. 1B is a sectional view of the main part of a modification of the semiconductor device shown in FIG. 1A.

Although the first embodiment has been described concerning a protection circuit with a CMOS transistor for power supply protection, the present invention is not limited to this. As shown in FIG. 1B, the arrangement shown in FIG. 1A may be used for signal output protection.

Referring to FIG. 1B, the source 112 and the substrate contact region 111 are connected to the power line 141, the gate electrode 122 and the gate electrode 124 are connected to the input contact 142, and the source 115 and the substrate contact region 114 are connected to the ground potential $V_{GND}$, serving as the low-potential power supply voltage, through the GND line 144. The drain 113, the impurity region 117, and the control electrode 126 are connected to the output terminal 143.

With this arrangement, the protective resistance element serves as a CMOS transistor for outputting an internal signal in response to a signal input from the input contact 142 and as a protection circuit against a surge which is mixed from the output terminal 143.

Second Embodiment

Figure 2A:
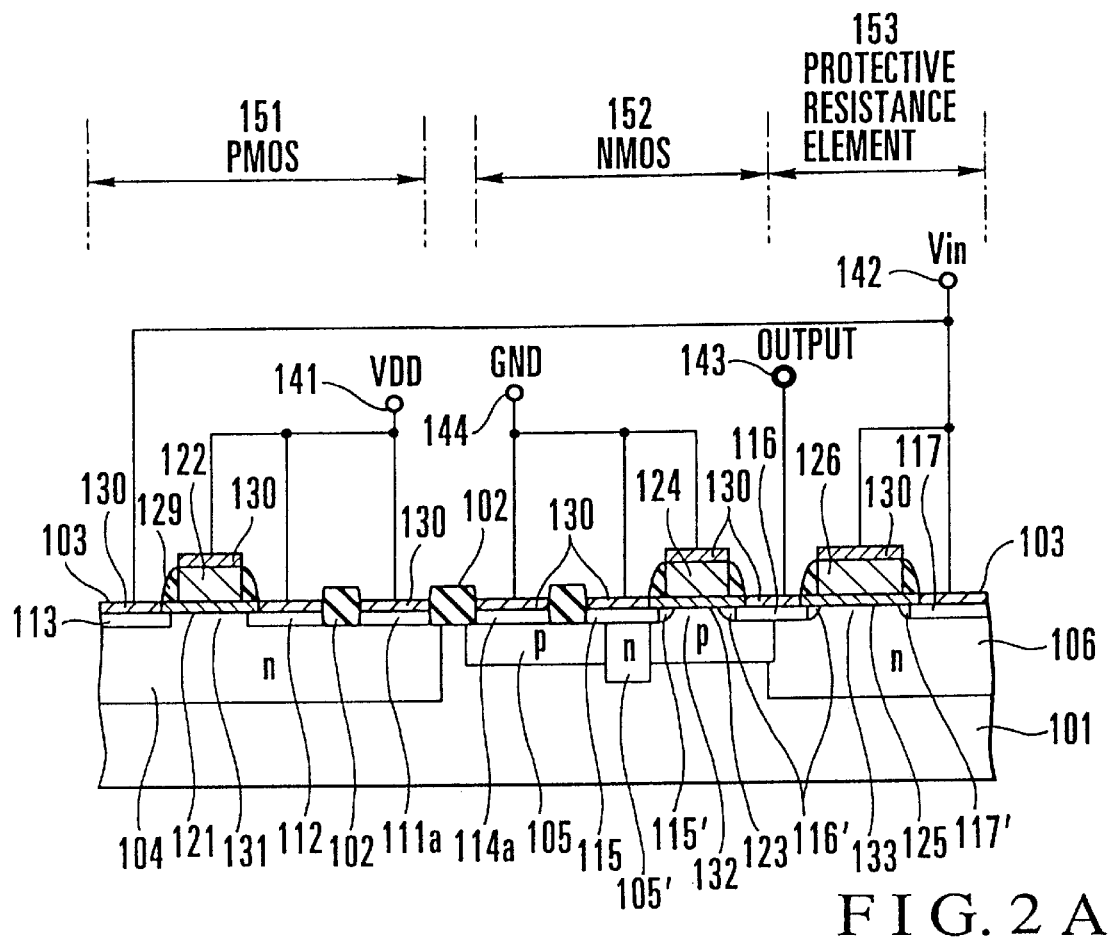
FIG. 2A is a sectional view taken along the line A–A' of FIG. 2B.

FIG. 2A shows the main part of a semiconductor device according to the second embodiment of the present invention. The characteristic feature of the second embodiment resides in that a third n-type well 105' is formed under a source 115 of a transistor 152.

Referring to FIG. 2A, a first n-type well 104, a p-type well 105, and a second n-type well 106 are formed at predetermined positions in regions partitioned by a silicon oxide film 102 that serves for element isolation of a substrate 101. The second n-type well 106 is adjacent to the p-type well 105.

In the second embodiment, the formation region of a transistor 151 and the formation region of the transistor 152 and a protective resistance element 153 are respectively surrounded by guard rings 111a and 114a. The guard ring 111a is an n$^+$-type impurity region formed of a major surface 103 of the substrate 101, and the guard ring 114a is a p$^+$-type impurity region formed of the major surface 103 of the substrate 101.

Figure 2B:
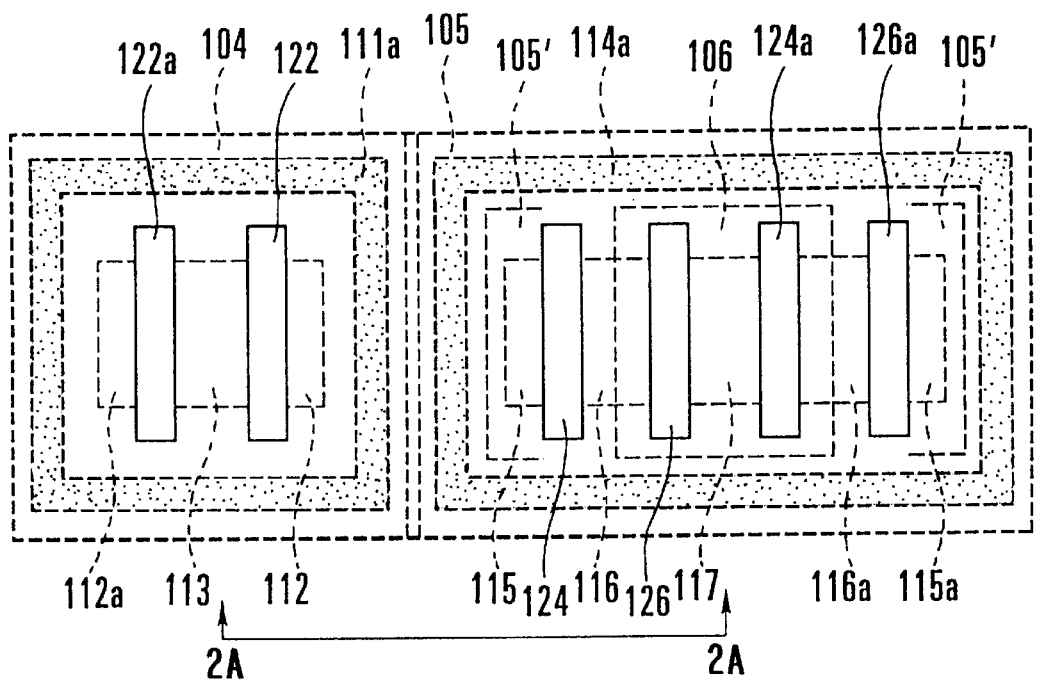
FIG. 2B is a sectional view of the main part of a semiconductor device according to the second embodiment of the present invention.
Figure 3:
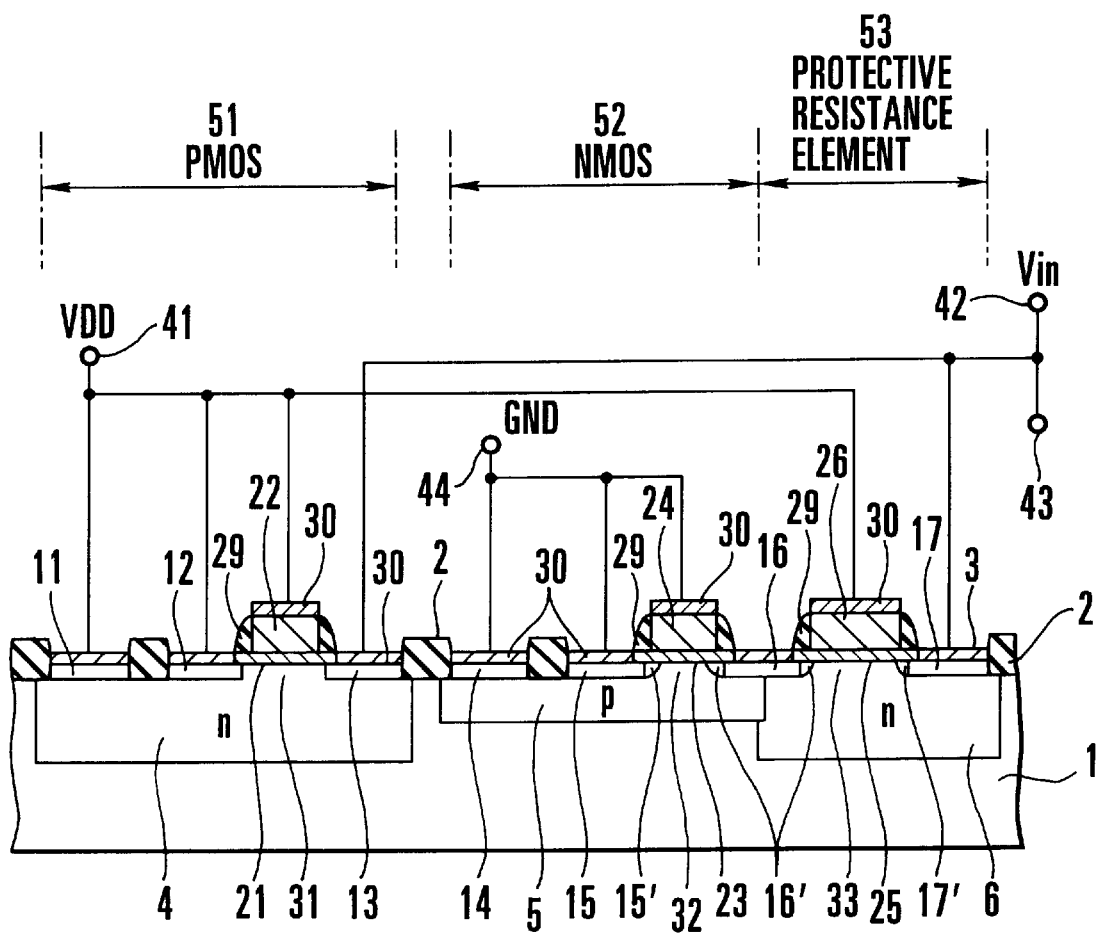
FIG. 3 is a sectional view showing the main part of a conventional CMOS circuit.

As shown in FIG. 2B, the guard ring 111a is formed to surround the transistor 151 having a p-channel MOS structure. The guard ring 114a is formed to surround the transistor 152 having an n-channel MOS transistor and the protective resistance element 153. FIG. 2A shows a section taken along the line A–A' of FIG. 2B.

Electrode wires (not shown) are extracted from a source 112, the source 115, and a drain 113 through a silicide film 130. The electrode wires are connected in the respective connection regions through a plurality of contacts having a predetermined size. Alternately, one contact may be formed to cover substantially the entire portion of each contact region, and the respective electrode wires may be connected to each other through the corresponding contacts. This moderates current concentration at the contact portions and causes the current to flow uniformly, leading to a higher protection ability.

FIG. 2B shows a state wherein the semiconductor device is constituted by two transistors each having a p-channel MOS structure, two transistors each having an n-channel MOS structure, and two protective resistance elements. More specifically, in the region on the first n-type well 104 surrounded by the guard ring 111a, a transistor consisting of a source 112a, the drain 113, and a gate electrode 122a, and the transistor 151 consisting of the source 112, the drain 113, and the gate electrode 122 are formed.

In the region surrounded by the guard ring 114a, a transistor consisting of the source 115, an impurity region 116 as a drain, and a gate electrode 124, and the transistor 152 consisting of a source 115a, an impurity region 116a as a drain, and a gate electrode 124a are formed on the p-type well 105 and a p-type well 105a, respectively.

In addition, the protective resistance element 153 consisting of the impurity region 116, an impurity region 117, and a control electrode 126, and another protective resistance element 153 consisting of the impurity region 116a, the impurity region 117, and a control electrode 126a are formed on the second n-type well 106.

In the second embodiment, the third n-type well 105' is formed under the source of the transistor 152 having an n-channel MOS structure. The third n-type well 105' has an impurity concentration lower than that of the source 115.

According to the second embodiment, although a guard ring structure is employed, the control electrode 126 is connected to the impurity region 117, in the same manner as in the first embodiment. Therefore, the resistance of the second n-type well 106 that exhibits the function as the resistor of the protective resistance element does not substantially change. Even if a positive surge is applied to the GND line 144, no stress is applied to the insulating film 125.

In the conventional arrangement, when a surge is applied, a higher voltage may be input to the internal circuit because of the voltage increase caused by the current flowing into the protective resistance element. In the second embodiment, an input to the internal circuit is extracted from the impurity region 116, in the same manner as in the first embodiment. Therefore, despite the presence of the protective resistance element 153, no unnecessarily high potential will be applied to the internal circuit.

In the second embodiment, since the third n-type well 105' is formed, the safety of the protection circuit can be further improved. More specifically, in the protection circuit of this semiconductor device, when a positive surge is applied to the GND line 144, the surge can be removed in the following manner.

When a positive surge is applied to the GND line 144, the gate end of the impurity region 116 that serves as the drain of the transistor 152 causes breakdown, and a surge current flows along the path of input contact 142—second n-type well 106—impurity region 116—p-type well 105 (substrate 1)—substrate contact (guard ring 114a).

Due to the resistance of the p-type well 105, if the current flowing to the p-type well 105 increases, the potential of the p-type well 105 increases to be higher than the GND potential. When the potential of the p-type well 105 increases, the potential difference of the p-n junction (diode) formed by the source 115 and p-type well 104 exceeds the built-in potential to form a forward bias. When this p-n junction forms a forward bias, a parasitic npn bipolar transistor formed by the drain/p-type well/source of the transistor 152 is turned on, and the surge flows out also along the path of input contact 142—second n-type well 106—impurity region 116—p-type well 105—source 115.

The lower the built-in potential at the p-n junction between the p-type well 105 (substrate 101) and transistor 152, the more easily a breakdown tends to occur at this p-n junction. If the third n-type well 105' is formed under the source 115 to have an impurity concentration lower than that of the source 115, a lower built-in potential state is formed at the interface between the third n-type well 105' and p-type well 105 (substrate 101). As a result, a diode formed in this interface tends to form a forward bias easily, causing a snap-back state easily.

The arrangement of the semiconductor device according to the present invention is not limited to input protection but can be similarly applied to output protection, as shown in FIG. 1A. As described above, an internal circuit protected by an input protection circuit can be connected to a protective resistance element, as a matter of course.

Although one or two transistors of the same conductivity type are arranged in the embodiments described above, the present invention is not limited to this. A plurality of transistor arrays each having three or more transistors of the same conductivity type may be arranged in parallel.

If only one transistor is to be used, the gate width must be increased. This disorders the element arrangement and interferes with an increase in integration degree. In contrast to this, if a plurality of transistors are used, the integration degree can be further improved. Note that in this case the resistance of each respective protective resistance element must be set such that the voltage at which the snap-back state is effected is lower than the voltage at which the transistor connected to the protective resistance element causes breakdown while it is set in a snap-back state.

More specifically, when the protective resistance element is connected in this manner and the voltage generated between the snap-back state and breakdown is set to a value equal to or lower than the voltage at which the snap-back state is effected, even if one transistor is set in a snap-back state prior to the snap-back state of other transistors, the plurality of other divisional transistors can also be set in a snap-back state. If all the plurality of transistors are set in a snap-back state, the surge can be dispersed uniformly.

As has been described above, according to the present invention, since a signal input to the drain of a field effect transistor passes through a protective resistance element, it causes a voltage drop even if it has an abnormal voltage, and a high-level abnormal voltage is prevented from being directly applied to the field effect transistor. The resistance of the well serving as the resistor does not largely change. As a result, the resistance of the protective resistance element does not change easily, and accordingly design of the protective resistance element is further facilitated.

When the potential of the power line is substantially equal to the ground potential, even if a positive surge is applied to the GND line, no stress is applied to the insulating film under the control electrode, and carriers will not be trapped by the insulating film. As a result, a change in resistance of the well is not easily caused by carrier trapping, and breakdown resistance of the insulating film can be improved.

More specifically, according to the present invention, design is further facilitated, and the function as the protection circuit is not easily impaired in any cases. Since a higher potential is not input to the internal circuit, the internal circuit can be protected in any case.

What is claimed is:

1. A semiconductor device comprising:
   a field effect transistor having first and second diffusion layers of a first conductivity type formed on a surface of a semiconductor substrate and serving as a source and a drain, respectively, and a gate electrode formed on a region sandwiched between said first and second diffusion layers through a gate insulating film; and
   a protective resistance element having a third diffusion layer of the first conductivity type formed on said surface of said semiconductor substrate to be separated from said second diffusion layer by a predetermined distance, a control electrode formed on said semiconductor substrate through an insulating film in a region sandwiched between said second and third diffusion layers, and a first well of the first conductivity type formed on said surface of said semiconductor substrate in said region sandwiched between said second and third diffusion layers to come into contact with said second and third diffusion layers, said field effect transistor and said protective resistance element being connected to one another through said second diffusion layer;
   wherein said control electrode is connected to said third diffusion layer so as to have the same electric potential as the third diffusion layer and said first well has an impurity concentration lower than those of said second and third diffusion layers; and
   wherein said device further comprises a second well of the second conductivity type formed under said first and second diffusion layers to come into contact therewith, said first well being deeper than said second well, and
   a third well of the first conductivity type having an impurity concentration lower than that of said first diffusion layer and formed to contact with said first diffusion layer and said second well.

2. A semiconductor device according to claim 1, further comprising a guard ring formed of a diffusion layer of a second conductivity type formed on said surface of said semiconductor substrate to surround a region where said field effect transistor and said protective resistance element are formed.

3. A semiconductor device according to claim 1,
   wherein a resistance of said protective resistance element is set to such a value that a voltage at which said field effect transistor is set in a snap-back state becomes lower than a voltage at which said field effect transistor causes breakdown so that said field effect transistor fails to function.

4. A semiconductor device according to claim 1, wherein said first to third diffusion layers are in contact with wiring electrodes to be connected thereto through an entire portion of a connection enable region.

5. A semiconductor device according to claim 1, wherein a connecting portion between said control electrode and said third diffusion layer is arranged on a region of said well of said protective resistance element.

6. The semiconductor device as recited in claim 1, wherein
   said protective resistance element has an input contact connected to said third diffusion layer for application of an external signal input, and
   an output terminal connected to said second diffusion layer to output a signal in response to said external signal input.

* * * * *